United States Patent [19]

Schuchardt

[11] 4,298,856

[45] Nov. 3, 1981

[54] METALLIZED RESISTOR AND METHODS OF MANUFACTURING AND ADJUSTING THE RESISTANCE OF SAME

[75] Inventor: Donald W. Schuchardt, Glen Ellyn, Ill.

[73] Assignee: Western Electric Company, Incorporated, New York, N.Y.

[21] Appl. No.: 72,371

[22] Filed: Sep. 4, 1979

[51] Int. Cl.³ .......................................... H01C 10/00
[52] U.S. Cl. .................................. 338/195; 29/620; 338/308; 338/309; 338/324; 338/325
[58] Field of Search ............... 338/195, 308, 309, 314, 338/49, 322, 324, 325; 29/620

[56] References Cited

U.S. PATENT DOCUMENTS

| | | | |
|---|---|---|---|
| 2,336,834 | 12/1943 | Bakke | 338/195 X |
| 2,629,166 | 2/1953 | Marsten et al. | 29/620 |
| 3,056,937 | 10/1962 | Pritikin | 338/195 |
| 3,071,749 | 6/1963 | Starr | 338/314 |
| 3,344,387 | 9/1967 | Kinkel et al. | 338/314 |
| 3,930,304 | 6/1976 | Keller et al. | 338/195 X |
| 4,041,440 | 8/1977 | Davis et al. | 338/193 |
| 4,146,957 | 4/1979 | Toenshoft | 29/620 X |

FOREIGN PATENT DOCUMENTS 2039920  2/1972  Fed. Rep. of Germany ...... 338/195

Primary Examiner—C. L. Albritton
Attorney, Agent, or Firm—K. R. Bergum

[57] ABSTRACT

Several planar configured, metallized resistor embodiments (25, 35, 45, 55, 65) are disclosed, as are several methods of manufacturing and resistance trimming the same, particularly to values of resistance lower than the "as fabricated" nominal value thereof. In accordance with one preferred resistor embodiment (25), a plurality of associated discrete conductive bonding pads (29) are formed on a common supporting substrate (27), with each pad being in conductive contact with a different spaced site along the body portion (25a) of the resistor between the terminating ends thereof. The bonding pads (29) are advantageously adapted to allow bonded wire connections to be made between different selected pairs thereof, after fabrication of the resistor, whenever necessary to incrementally reduce the initial nominal value of resistance of the resistor to a lower desired value.

In accordance with several other resistor embodiments (35, 55, 65), the bonding pads (41 and 42, 59, 72) thereof are arranged in clusters so as to allow the use of solder bridges, as well as bonded wires, to interconnect selected ones of adjacent pairs of the pads as required to establish a desired lower value of resistance.

Also in accordance with the principles of the invention, one illustrative resistor (45) incorporates a plurality of short-circuiting shunts (52), in addition to a plurality of bonding pads (47). The shunts are interconnected to the body portion (45a) of the resistor at different spaced sites therealong such that when selectively opened, the then existing value of resistance of the resistor is incrementally increased, whereas when short-circuit connections are selectively established between different pairs of the bonding pads (47), the then existing resistance of the resistor is incrementally decreased.

26 Claims, 5 Drawing Figures

METALLIZED RESISTOR AND METHODS OF MANUFACTURING AND ADJUSTING THE RESISTANCE OF SAME

BACKGROUND OF THE INVENTION

1. Field of the Invention

This invention relates to re-adjustable planar configured resistive elements and, more particularly, to methods of manufacturing and resistance trimming those of the metallized film type.

2. Background of the Invention

In many integrated and hybrid integrated circuits, including those of the thin and thick film types, there has been a need for planar configured metallized resistors. Regardless whether such resistors are of the integrated circuit diffused type, or of the plated, etched foil or thin or thick film type, there has often been a need to adjust such resistors (all generally referred to herein as being of the metallized type) after their complete fabrication as an integral part of a composite circuit. In a typical application, the "as fabricated" value of resistance of a given metallized resistor may often have to be adjusted either upwardly or downwardly in value to optimize the operating performance, or to balance, or to otherwise satisfy a critical operating requirement, of a given associated device, or circuit, or sub-circuit within a larger composite circuit.

The need for resistance trimming metallized resistors of relatively high value, in particular, is due in large measure to the fact that whether they are made as a diffused element in an epitaxial layer of an integrated circuit, or as thin or thick film elements fabricated on the surface of a ceramic substrate, variations from a desired nominal value may often be as large as plus or minus 25%. Such deviations are generally experienced because of the many processing variables that cannot, at least at present, be controlled within stringent limits, particularly in high volume production operations.

With respect to adjusting the resistance of filmtype resistors in particular, they may be readily increased by utilizing conventional techniques, such as selective anodization, chemical etching or laser or mechanical machining. Alternatively, the nominal resistance of such resistors may also be increased by forming the resistive element with one or more parallel current-steering paths and, thereafter, selectively forming open circuits along selected ones of such paths, as disclosed in U.S. Pat. No. 4,041,440, of J. L. Davis.

A similar technique is disclosed in U.S. Pat. No. 3,930,304, of H. Keller et al., wherein a plurality of serially connected diffused resistors forming part of an integrated circuit are each short-circuited by a different metallized shunt, as fabricated. Each shunt is adapted to be selectively opened by a pulse of current applied therealong, with the particular shunts opened determining the final value of total series resistance. In order to adjust the total series resistance both upward and downward utilizing this technique, each resistor must be manufactured with a different nominal value of resistance. Unfortunately, this may not always be desired, or possible, in many circuit applications.

A technique for effecting either upward or downward trimming of individual film-type resistors is disclosed in U.S. Pat. No. 3,071,749, of J. E. Starr. in accordance with that disclosure, an insulative layer is interposed between a foil-formed patterned resistor and a planar metal sheet, with one terminal connection being made to the resistor at one end and either at a point on the metal sheet adjacent the opposite end of the resistor, or to both the resistor and the sheet at the opposite end of the resistor. In the latter case, only a downward change in resistance may be produced by establishing an electrical connection between a given point intermediate the ends of the resistor and an underlying point on the metal sheet. This is accomplished by removing a discrete area of the insulative layer disposed between the patterned resistor and metal sheet, and then making a permanent solder connection therebetween. Should the adjusted value of resistance be too low, then the initially established solder connection must be eliminated, and a new one established at a slightly different location. Unfortunately, any previously established soldered connection of the type in question is not readily eliminated, because the discrete area of the intermediate insulative layer necessarily removed for that purpose now exposes the resistor to the metal sheet. The resistance trimming technique in question is thus less than completely desirable from a reversability standpoint. In addition, locating the precise point on the insulated underlying metal sheet where a short-circuit connection should be made with the overlying resistor, in order to produce a value of resistance within stringent limits, is not always readily determinable without a certain amount of trial and error.

In view of the foregoing, in many circuit applications wherein the "as fabricated" nominal value of resistance exhibited by a metallized resistor must be lowered, in particular, to balance the internal resistance or impedance of an associated discrete circuit device, for example, it has often been necessary, or at least most expedient from an alternative standpoint, to simply match such circuit devices, through a sorting process, with the respectively associated resistors, as fabricated. In large volume manufacture, however, the need to stock and sort large volumes of circuit devices according to their internal resistance (or impedance) values is both costly and time consuming.

SUMMARY OF THE INVENTION

It, therefore, is an object of the present invention to provide an adjustable, patterned metallized resistor of simplified and inexpensive construction, as well as methods of manufacturing and adjusting the resistance of same, the latter in either an increasing or decreasing, as well as reversible, manner after fabrication.

In accordance with the principles of the present invention, the above and other objects are realized in one preferred illustrative embodiment wherein a metallized film type resistor is formed initially on a suitable substrate, such as of ceramic material, with a sufficient number of spaced auxiliary bonding pads fabricated either directly on the surface of the resistor, or spaced therefrom but circuit-path connected thereto.

Downward resistance trimming of the resistor from an initial nominal value of resistance may thereafter be readily effected by interconnecting predetermined ones of the bonding pads, after circuit assembly, so as to short out the necessary portion(s) of the resistor, as fabricated, to achieve a desired lower value of resistance for a given circuit application.

The necessary interconnection(s) between selected ones of the auxiliary bonding pads is preferably accomplished by stitch-bonding one or more precious metal wires, such as of gold, between the one or more predetermined pairs of spaced bonding pads. Alternatively, such pads may be arranged in closely spaced clusters and formed either on the resistor or at remote locations therefrom. Such clusters allow the use of small globs of solder, for example, to form short-circuiting bridges between selected pairs of bonding pads.

In accordance with another aspect of the invention, a plurality of short-circuiting shunts, initially formed on the substrate and connected between different spaced points along the resistor, are adapted to be readily open-circuited selectively either by the application of suitably applied pulsed energy, or by a machining or chemical etching operation, so as to produce the final desired value of resistance for the resistor. Such a combination of both pre-existing and possible post-existing open and short-circuit conditions allows even greater control over either decreasing or increasing resistance trimming, as well as reversible trimming, of a given resistor after fabrication. Even further control over resistance trimming may be effected, of course, by initially locating the successively spaced auxiliary bonding pads such that they sub-divide the total value of resistance of the resistor into increments of progressively increasing or decreasing value, such as by factors of 2, 3 or 4, et cetera, or in some other desired manner, such as exponentially.

DETAILED DESCRIPTION OF THE INVENTION

It should be appreciated that while the invention is described in detail herein in connection with the manufacture and resistance adjusting of metallized resistors of the thin and thick film types, the methods of adjusting resistance embodied herein also have applicability with respect to etched foil or plated resistors fabricated on printed circuit boards, or to diffused resistors incorporated in integrated circuitry. As previously noted, all of such resistors are generally defined herein as being of the metallized type.

Figure 1:
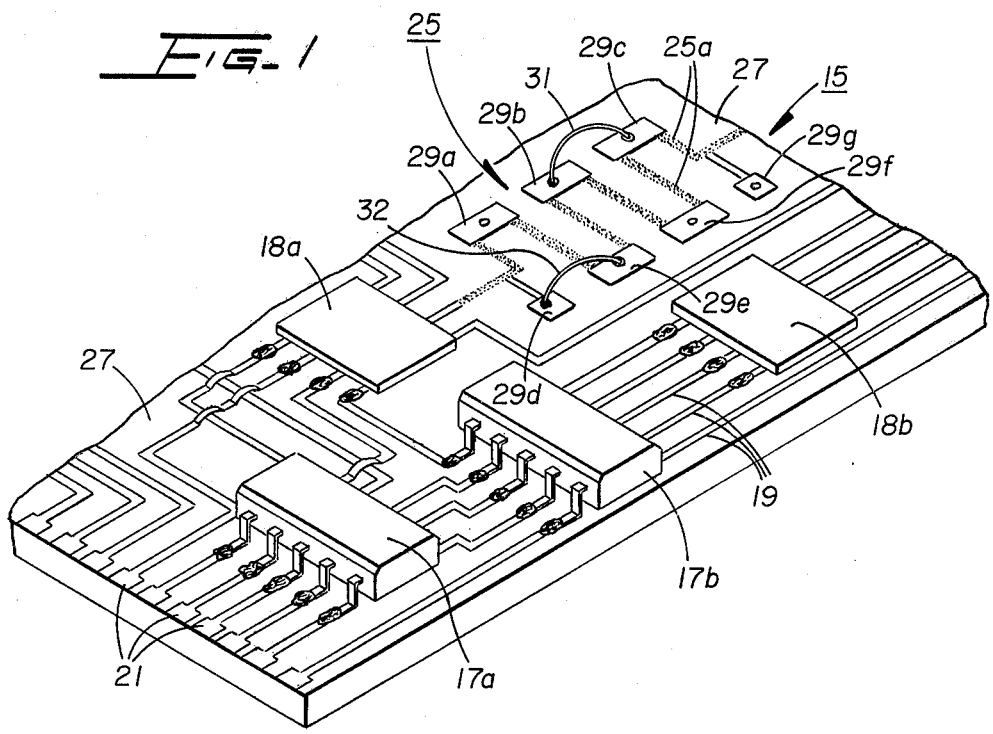
FIG. 1 is an enlarged, fragmentary perspective view of an illustrative thin film integrated circuit which incorporates an adjustable thin film resistor constructed with a plurality of auxiliary bonding pads, the latter facilitating the adjustment of the nominal value of the resistor, as fabricated, in accordance with the principles of the present invention.

With particular reference first to FIG. 1, there is shown a fragmentary view of a thin film circuit 15 comprised in part of two integrated circuit modules 17a and b, and two circuit chips 18a and b, selectively interconnected by a plurality of thin film metallized circuit paths 19, with certain ones of the paths selectively terminating in edge-disposed terminals 21, all fabricated and supported on a suitable substrate 27, such as of ceramic material.

Also by way of illustration, and in accordance with the principles of the present invention, a thin film resistor 25 is shown connected in series between an output terminal of the integrated circuit chip 18a and one of terminals 21, which one terminal may be at ground potential, for example. Such a resistor may be required, for example, to provide a desired resistance output (or input) load associated with the active integrated circuit chip 18a, or in other applications may be employed to balance the internal circuit resistance or impedance of a given circuit element thereof, or of a discrete device, or to otherwise optimize the operating performance, efficiency or effectiveness of any of the foregoing.

As illustrated, the resistor 25 comprises a main body portion 25a of serpentine configuration, connected at one end to a device terminal, through an associated thin film path 19, and at the other end to a conductive terminal 21. In many applications, as illustrated in FIGS. 2–5, both ends of the thin film resistor may terminate in enlarged integral conductive terminals, particularly when the resistor is formed in an interior or central region of the substrate. Such enlarged terminals greatly facilitate connections being made to the resistor by any suitable bonding process.

Thin film resistors of the types illustrated in FIGS. 1–5 typically have thicknesses in the range of 0.1 to 0.5 microns, generally producing nominal values of resistance in the range of 10 to 50,000 ohms. Resistors of this type are typically made of tantalum nitride, heat stabilized at a temperature in the range of 275° C. to 325° C., for a period of 1.5 to 2.5 hours. The tantalum nitride is generally applied utilizing a conventional sputtering process, followed by a photolithographic selective etching process to form the resistive and conductive patterns on the surface of the substrate 27, such as of ceramic. It is apparent, of course, that precious metals, such as gold, or other nonprecious metals, such as nichrome, may also be used as the metallic part of the resistive material, which materials may be applied by either an evaporation or sputtering process. In such cases, a lower value of resistance for a given thickness and surface area of resistive material will normally be realized.

In the case of thick-film resistors, they would typically have a thickness on the order of 0.10 to 0.50 mils, and would normally be formed in a desired pattern by utilizing a silk-screen process. Thick film resistors are generally comprised of metallic and glass particles suspended in a liquid organic vehicle. Upon firing this screened material in a furnace at a temperature in the range of 850° 900° C., for a period of 0.5 to 1.0 hour, the organic vehicle is vaporized while the metallic and glass particles fuse to the substrate surface to form the resistor.

Alternatively, as previously noted, the metallized resistor 25 could take the form of an etched foil, or plated, metal resistor (generally of considerably greater thickness than a thick film resistor), or a diffused resistor formed in a previously established epitaxial layer of an integrated circuit, all in accordance with well-known manufacturing techniques, one of which, with respect to diffused resistors, is disclosed in the aforementioned Keller et al. patent.

With particular reference again to the thin film resistor 25 of serpentine configuration in FIG. 1, there are formed, in accordance with an aspect of the invention, a plurality of highly conductive auxiliary bonding pads 29a-g at spaced intervals directly on the resistor body portion 25a. By way of example only, the bonding pads 29 are shown formed to overlie the short leg segments which interconnect the respectively adjacent longer leg segments forming the main body portion 25a of the resistor 25. It will be appreciated, of course, that a different number of bonding pads, as well as different locations therefor, may be employed with respect to a given resistor so as to provide the degree of resistance trimming required for a particular circuit application. Alternatively, the bonding pads may also be located at remote locations relative to the main body portion of the resistor, and interconnected thereto through interconnecting conductive circuit paths, as will be described in greater detail in connection with several other preferred embodiments of the invention.

The auxiliary bonding pads 29 would normally be considerably thicker than the body portion of the resistor, whether of the thin or thick film type, so as to facilitate the bonding of short-circuiting wires, such as wires 31, 32, between two selected pairs of bonding pads 29b and c and 29d and e, respectively, as illustrated. In the case of using fine gauge precious metal wire for such interconnections, conventional stitch-bonding techniques may be readily employed for this purpose. Stitch-bonding has the advantages of allowing very accurate control over the positioning of the wires on the bonding pads, and of effecting reliable thermocompression bonds between the wires and pads thereafter.

Depending on the number of auxiliary bonding pads 29 employed, any desired degree of incremental downward resistance trimming may be effected, the actual number of such increments, as well as the magnitudes thereof, being directly dependent on the number of auxiliary bonding pads provided, and on the respective spacings therebetween. As previously noted, graduated spacings between the respectively adjacent pairs of bonding pads would greatly increase the number of possible resistance changes that could be made with respect to any given resistor.

Should readjustment of the resistor 25 subsequently be required, such as when an associated IC device must be replaced, any previously bonded wire(s) may be readily removed, or simply severed, with one or more new wires being bonded between selected ones of the auxiliary bonding pads 29, as required, to establish either a desired increase, or decrease, in the resistance then exhibited by the resistor. In such situations, it is significant to note that a necessary increase in resistance may be readily effected in most cases without having to resort to conventional time consuming and expensive anodization, chemical etching or material machining processes.

Figure 2:
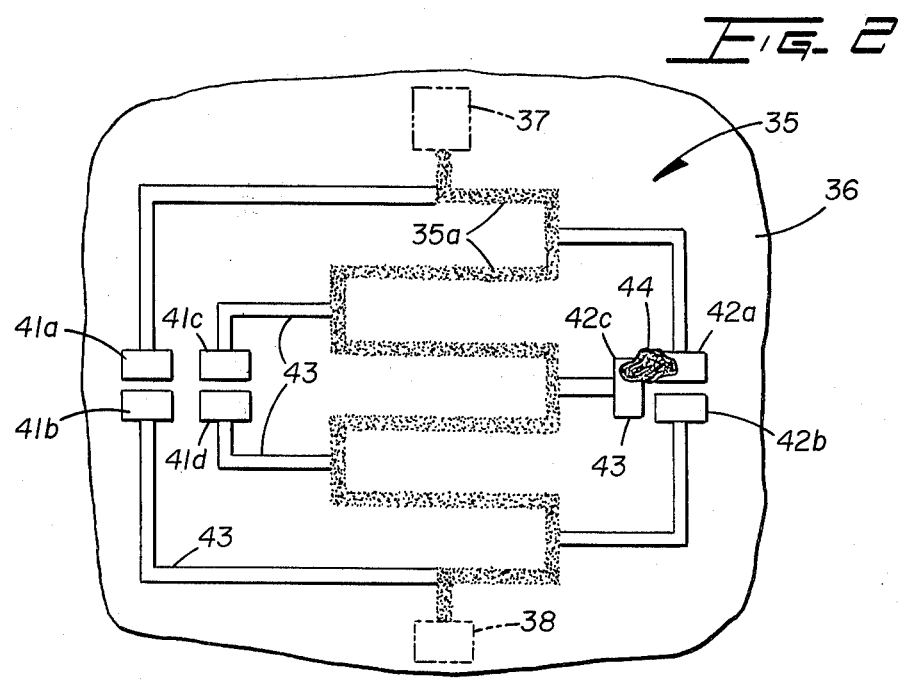
FIG. 2 is an enlarged, fragmentary view of a thin film resistor similar to the one depicted in FIG. 1, but distinguishing therefrom by having the auxiliary bonding pads closely spaced in several clusters so as to facilitate the formation of soldered connections, as well as bonded wire connections, between different pairs thereof.

FIG. 2 illustrates a metallized resistor 35 of the thin film type supported on a ceramic substrate 36, with a body portion 35a, formed in a serpentine configuration, interposed between two connecting terminals 37, 38, optionally formed as a part thereof, as illustrated in phantom. The resistor 35 distinguishes from the resistor 25 of FIG. 1 in that a plurality of auxiliary bonding pads, arranged in two clusters 41a-d and 42a-c, are connected to the main body portion of the resistor through respective conductive circuit paths, designated generally by the reference manual 43. By arranging the bonding pads in clusters, this advantageously allows the use of a simple glob of solder 44, for example, to interconnect any two adjacent pads, such as 42a and c, to effect the short-circuiting of an associated part of the resistor body portion 35a. As such, the use of interconnecting wires, as employed in the first embodiment, is optional for effecting a downward resistance adjustment, in particular, of the resistor 35.

Figure 3:
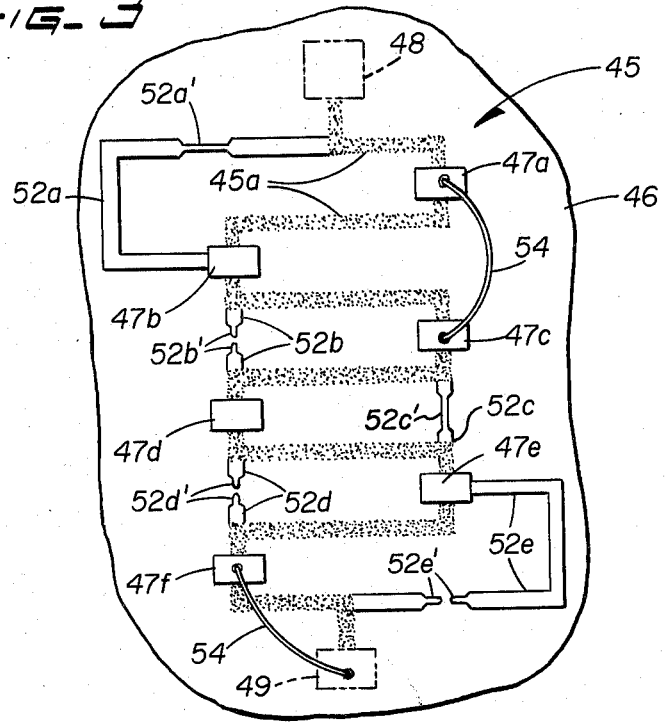
FIG. 3 is an enlarged, fragmentary view of still another illustrative film type resistor embodiment which incorporates not only a spaced array of auxiliary bonding pads, but a plurality of fabricated short-circuiting shunts that may be selectively opened so as to facilitate, in conjunction with selectively interconnected bonding pads, both upward and downward resistance trimming of the resistor after fabrication.

FIG. 3 illustrates another embodiment of the invention wherein a metallized resistor 45, such as of the thin film type, is fabricated on a suitable substrate 46, with a serpentine body portion 45a, and a plurality of auxiliary bonding pads 47a-f fabricated directly on the latter at spaced points therealong, in a manner similar to that employed in the resistor 25 of FIG. 1. Two optional terminals 48, 49 are also shown connected to opposite ends of the resistor body portion.

The resistor 45 distinguishes from the resistor 25 of the first embodiment by including a plurality of short-circuiting shunt paths 52a-e, which extend between different discrete points along the body portion 45a of the resistor. By way of example, the shunts 52a and c are shown in their "as fabricated" short-circuiting condition, whereas shunts 52b, d and e are are shown as having been severed along their respective lengths, such as by means of suitably applied path-opening pulses of electrical energy, or by a material machining operation. Opening any given shunt 52 after the fabrication of the resistor will, of course, increase the resistance thereof by a predetermined incremental amount. To facilitate effecting such open circuit conditions, the short-circuiting shunts 52 are shown formed with optional necked-down regions 52a' to e'. Also by way of illustration, one stitch-bonded wire 54 is shown short-circuiting an upper part of the resistor body portion of the resistor by being interconnected between adjacent bonding pads 47a and c on the right side of the resistor, as viewed.

It is apparent, of course, that by utilizing a combination of both "as fabricated" closed-circuit shunts and auxiliary bonding pads, any number of possible resistance changes, in predetermined increments, may be made from the nominal value of resistance in either an upward or downward direction. This becomes particularly evident when it is realized that the selective use of open and short circuit conditions between predetermined points along the resistor body portion can effectively divide the resistor into a plurality of not only series, but parallel, connected segments along its length. A parallel segment, for example, is established by the "as fabricated" and subsequently established short-circuit shunts 52a and 54, respectively. Moreover, it also becomes readily apparent that any original short-circuiting shunt 52 that has been opened for purposes of effecting a given upward resistance adjustment, may be readily closed again by simply providing either a solder bridge or a bonded wire connection across the open space of such a shunt.

It should also be understood that the bonding pads 47 of the resistor 45 could be readily arranged in clusters, as embodied in the resistor 35 of FIG. 2, if desired, so as to more readily allow the use of solder bridges, as well as very short bonded shunt wires, to effect any desired resistance adjustment. Concomitantly, the spacings between successive bonding pads 47, as well as the lengths of successive resistor segments initially short-circuited by the shunts 52, could be chosen so as to effect a multitude of different respective magnitudes of change in resistance of the resistor, as desired.

In many circuit applications, it may not be necessary to form the main body portion of a film, etched foil, plated or diffused type of resistor in a serpentine or any other specially configured pattern in order to produce the desired, or required, value of nominal resistance. More specifically, it may often only be necessary to form the resistor body portion as an elongated rectangular bar, or as a sheet of metallized resistive material.

Figure 4:
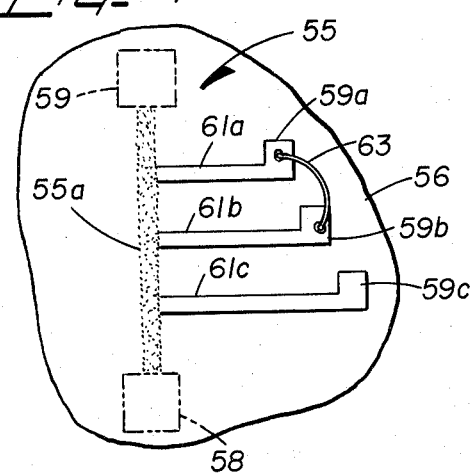
FIGS. 4 and 5 are enlarged, fragmentary views of two additional alternative embodiments of film type resistors wherein the resistor body portions are in continuous sheet form, with a plurality of spaced auxiliary bonding pads conductively connected thereto being either located at remote locations relative to the resistor body portion, as depicted in FIG. 4, or fabricated directly thereon, as depicted in FIG. 5.
Figure 5:
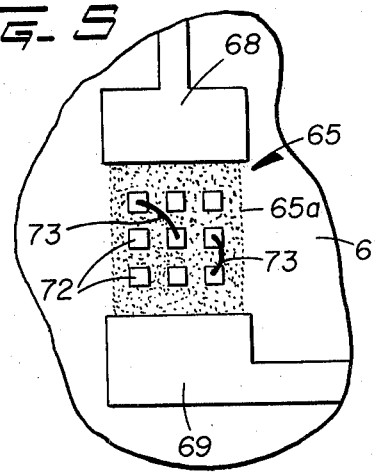

FIG. 4 illustrates a resistor 55 of such a form embodying the principles of the present invention. The resistor 55 is formed on a substrate 56 as a metallized resistive film, having a simple rectangular body portion 55a connected at opposite ends to two optional terminals 57, 58. In accordance with an aspect of the invention, a plurality of remotely positioned bonding pads 59a-c are respectively connected to different points either uniformly or variably spaced along the body portion 55a of the resistor, by means of respectively associated conductive paths 61a-c. As thus arranged, one or more short-circuiting wires, such as wire 63, may each be bonded to a different pair of bonding pads, such as pads 59a and b, to effect a desired downward change in resistance of the resistor in the same manner as described hereinabove in connection with the other illustrative embodiments.

It is understood, of course, that if the main body portion 55a of the resistor 55 is appreciable size, the auxiliary bonding pads 59 could be readily formed in a series array directly on the surface thereof, as is the case in the embodiments of FIGS. 1 and 3. Alternatively, the bonding pads 59 could also be readily arranged in a cluster (or clusters) at a location remote from the resistor body portion, as in the embodiment of FIG. 2, or directly on the latter if of appreciable size, as in the embodiment of FIG. 5, now to be described.

In this last illustrative embodiment, an adjustable metallized resistor 65 includes a resistor body portion 65a, in the form of a rectangular sheet of appreciable cross-sectional area, fabricated on a suitable substrate 67, with a pair of terminals 68, 69 connected to two mutually disposed sides thereof. In accordance with the principles of the present invention, an array of auxiliary bonding pads 72 are formed directly on the surface of the body portion of the resistor. Depending on the spacings between bonding pads, adjacent ones thereof could be short-circuited, as required, either by bonding one or more discrete wires 73 therebetween (two being shown), or by establishing solder bridges therebetween.

It should also be appreciated that any number of auxiliary short-circuiting conductive shunts (not shown) could be formed on the substrate outside the boundaries of the resistor body portion, with each such shunt being conductively interconnected between selected discrete sites in the resistor body portion, or between a selected site and bonding pad, in a manner similar to that disclosed in the embodiment of FIG. 3. Such an arrangement would allow even more control over not only downward, but upward resistance trimming in a simple, inexpensive and reliable manner at any time after complete fabrication of such a resistor.

While several related and preferred resistor embodiments, as well as methods of manufacturing and adjusting same, have been disclosed herein, it is obvious that various other modifications may be made to the present illustrative embodiments and methods of the invention, and that a number of alternative related embodiments and methods could be devised by one skilled in the art without departing from the spirit and scope of the invention.

What is claimed is:

1. An adjustable planar configured resistor comprising:
   insulative support mean;
   a relatively thin layer of resistive material formed in a desired configuration on, and supported by, said support means, said resistive layer defining the main body portion of said resistor, and having at least two conductive terminals connected to end regions thereof for completing electrical connections to said main body portion, said body portion comprising a thin-film layer of resistive material formed into a series of closely spaced, serially connected segments arranged in a serpentine configuration;
   a plurality of conductive bonding pads formed as an integral part, and on the upper side, of respective discrete areas of said thin film resistor body portion between at least said two terminals thereof, said bonding pads being of sufficient cross section to allow conductive short-circuiting interconnections to be made between different selected pairs thereof, after fabrication of the resistor, whenever necessary to reduce the initial nominal value of resistance of said resistor to a lower desired value.

2. An adjustable resistor in accordance with claim 1 wherein at least one conductive wire is bonded at opposite ends to different ones of a predetermined spaced pair of said bonding pads so as to short-circuit that part of the resistor body portion therebetween and, thereby, lower the nominal value of resistance of said resistor as fabricated to a desired value for a given circuit application.

3. An adjustable planar confined resistor comprising:
   insulative support means;
   a relatively thin layer of resistive material formed in a desired configuration on, and supported by, said support means, said resistive layer defining the main body portion of said resistor, and having at lest two conductive terminals connected to end regions thereof for completing electrical connections to said main body portion, said body portion comprising a thin-film layer of resistive material formed into a series of closely spaced, serially connected segments arranged in a serpentine configuration, and,
   a plurality of conductive bonding pads formed as an integral part, and on the upper side, of respective discrete areas of said thin film resistor body portion between at least said two terminals thereof, said bonding pads being of sufficient cross-section, and arranged on said resistor body portion such that at least selected adjacent ones of said pads are spaced sufficiently close, to allow short-circuiting solder bridges and bonded interconnections to be selectively formed therebetween so as to lower the nominal resistance of said resistor as fabricated to a desired lower value.

4. An adjustable resistor in accordance with claim 3 wherein at least one solder bridge connection is completed between a predetermined pair of said closely spaced bonding pads to lower the nominal value of resistance of said resistor as fabricated to a desired lower value.

5. An adjustable resistor in accordance with claim 3 wherein at least one conductive wire is bonded at opposite ends to different ones of a predetermined spaced pair of said bonding pads so as to short-circuit that part of the resistor body portion therebetween and, thereby, lower the nominal value of resistance of said resistor as fabricated to a desired value for a given circuit application.

6. An adjustable planar configured resistor comprising:
   insulative support means;
   a relatively thin layer of resistive material formed in a desired configuration on, and supported by, said support means, said resistive layer defining the main body portion of said resistor, and having at least two conductive terminals connected to end regions thereof for completing electrical connections to said main body portion, and
   a plurality of discrete conductive bonding pads formed on and supported by said support means, each pad being in conductive contact with a different spaced site along the body portion of said resistor between at least said two terminals thereof, said bonding pads being of sufficient cross-section, and arranged on said support means such that at least selected adjacent ones of said pads are spaced sufficientl close, to allow selectively short-circuiting solder bridges and bonded interconnections to be formed between selected adjacent pairs thereof, after fabrication of the resistor, so as to lower the nominal resistance of said resistor as fabricated to a desired lower value.

7. An adjustable resistor in accordance with claim 6 wherein at least one solder bridge connection is completed between a predetermined pair of said closely spaced bonding pads to lower the nominal value of resistance of said resistor as fabricated to a desired lower value.

8. An adjustable resistor in accordance with claim 6 further comprising a plurality of short-circuiting shunts which are initially formed on said support means and connected between different spaced points along said body portion of said resistor, said shunts, when selectively opened, causing the nominal value of resistance of said resistor as fabricated to be increased, whereas a short-circuit connection when established between two selected ones of said bonding pads causes the resistance of said resistor as fabricated to be lowered.

9. An adjustable resistor in accordance with claim 8 wherein at least one of said short-circuiting conductive shunts is opened to increase the nominal resistance of said resistor as fabricated to a predetermined higher desired value.

10. An adjustable resistor in accordance with claim 8 wherein at least one short-circuit path is established between two selected bonding pads of said resistor so as to decrease the nominal value of resistance of said resistor as fabricated to a predetermined desired value.

11. An adjustable resistor in accordance with claim 8 wherein at least one of said short-circuiting conductive shunts is opened, and at least one short-circuit path is established between two of said bonding pads so as to adjust the nominal value of resistance of said resistor as fabricated to a desired final value on a selected side of said nominal value.

12. An adjustable planar configured, metallized resistor comprising:
   insulative support means;
   a relatively thin layer of resistive material formed in a desired configuration on and supported by said support means, said resistive layer defining the main body portion of said resistor, and having at least two conductive terminals connected to end regions thereof for completing electrical connections to said main body portion;
   a plurality of discrete conductive bonding pads formed on and supported by said support means, each pad being in conductive contact with a different spaced site along the body portion of said resistor between at least said two terminals thereof, said bonding pads being of sufficient cross-section to allow conductive short-circuiting interconnections to be made between different selected pairs thereof, after fabrication of the resistor, whenever necessary to reduce the initial nominal value of resistance of said resistor to a lower desired value, and
   a plurality of short-circuiting shunts initially formed on said support means and connected between different space points along said body portion of said resistor so as to initially respectively short out those segments of the resistor body portion disposed therebetween, said shunts, when selectively opened, causing the nominal value of the resistance of said resistor selectively as fabricated and subsequently adjusted to be increased by a predetermined magnitude, whereas said short-circuit connection when established between two selected ones of said bonding pads causes the then existing resistance of said resistor to be lowered by a predetermined magnitude.

13. An adjustable resistor in accordance with claim 12 wherein at least one of said short-circuiting conductive shunts is opened so that, in combination with at least said one short-circuit path also established between said two selected bonding pads, the nominal value of resistance of said resistor as fabricated is adjusted to a desired final value on a selected side of said nominal value.

14. A resistance adjustable electrical circuit comprising:
   insulative support means;
   an electrical circuit fabricated on at least one surface of said support means, including a resistance adjustable, planar configured resistor, said resistor comprising a relatively thin layer of resistive material formed in a desired configuration on, and supported by, said support means, said resistive layer defining the main body portion of said resistor, and having at least two conductive terminals connected to end regions thereof for completing electrical connections to said main body portion;
   a plurality of discrete conductive bonding pads formed on and supported by said support means, each pad being in conductive contact with a different spaced site along the body portion of said resistor between at least said two terminals thereof, said bonding pads being of sufficient cross-section to allow conductive short-circuiting interconnections to be made between different selected pairs thereof, after fabrication of the resistor, whenever necessary to reduce the initial nominal value of resistance of said resistor to a lower desired value;

at least one conductive member interconnecting a selected pair of said bonding pads so as to provide a short-circuit path around that part of the resistor body portion therebetween and, thereby, lower the nominal value of resistance of said resistor as fabricated to a desired value for a given circuit application, and a plurality of short-circuiting shunts initially formed on said support means and connected between different spaced points along said body portion of said resistor, said shunts, when selectively opened, causing the nominal value of resistance of said resistor selectively as fabricated and subsequently adjusted to be increased by a predetermined magnitude, whereas said short-circuit path upon being established between said two selected ones of said bonding pads causes the then existing resistance of said resistor to be lowered by a predetermined magnitude.

15. A resistance adjustable electrical circuit in accordance with claim 14 wherein at least one of said short-circuiting conductive shunts is opened so that, in combination with at least said one short-circuit path also established between said two selected bonding pads, the nominal value of of resistance of said resistor as fabricated is adjusted to a desired final value on a selected side of said nominal value.

16. A method of adjusting the resistance of a planar configured, and insulatively supported resistor having two terminating ends, said method comprising the steps of:

forming a plurality of discrete conductive bonding pads in a predetermined array on a common insulative support with the resistor, and arranging each of said bonding pads so as to be in conductive contact with a different spaced site along the body portion of said resistor between said terminating ends thereof, said formed bonding pads being of sufficient cross-section and closely spaced in at least one predetermined cluster so as to facilitate conductive short-circuiting interconnections to be made between different selected pairs thereof, after fabrication of the resistor, selectively by solder bridges and bonded wiring, whenever necessary to reduce the initial nominal value of resistance of said resistor to a lower desired value, and interconnecting at least two of said plurality of bonding pads with an auxiliary conductive member so as to provide a short-circuit path around that part of the resistor body portion therebetween and, thereby, lower the nominal value of resistance of said resistor as fabricated by a desired predetermined magnitude for a given circuit application.

17. A method in accordance with claim 16 wherein said interconnection is effected by forming a solder bridge between said selected pair of bonding pads.

18. A method in accordance with claim 17 wherein said cluster of bonding pads are formed at a location remote from the body portion of said resistor, and further comprising the step of:

interconnecting the respective bonding pads to different ones of the spaced sites along said resistor body portion by forming separate conductive paths therebetween on said insulative support.

19. A method in accordance with claim 16 wherein said bonding pads are respectively formed at different spaced sites on said body portions of said resistor.

20. A method in accordance with claim 16 further comprising the step of:

forming a plurality of short-circuiting shunts on said common insulative support, said shunts extending between different spaced points along the body portion of said resistor so as to initially respectively short out those segments of the resistor body portion disposed therebetween, said shunts, when selectively opened, causing the nominal value of resistance of said resistor selectively as fabricated and subsequently adjusted to be increased by a predetermined magnitude, whereas said short-circuit connection upon being established between said two selected ones of said bonding pads effects the lowering of the resistance of said resistor by a predetermined magnitude.

21. A method in accordance with claim 20 further comprising the step of:

opening at least a selected one of said short-circuiting conductive shunts so as to adjust the nominal value of resistance of said resistor, in conjunction with said established short-circuit path, to a desired final value on a selected side of said nominal value.

22. A method in accordance with claim 21 wherein the step of establishing at least one short-circuit path between two selected ones of said bonding pads is effected by stitch-bonding opposite ends of a fine gauge wire to different ones of said selected pair of bonding pads.

23. A method of fabricating an adjustable planar configured resistor having two terminating ends, comprising the steps of:

forming a resistive material layer on the surface of an insulative member in accordance with a predetermined pattern, said resistive layer comprising the main body portion of said resistor;

forming a plurality of discrete conductive bonding pads in a predetermined array on said insulative member, and arranging each of said bonding pads so as to be in conductive contact with a different spaced site along the body portion of said resistor between said terminating ends thereof, said bonding pads being of sufficient cross-section to allow conductive short-circuiting interconnections to be made between different selected pairs thereof, after fabrication of the resistor, whenever necessary to reduce the initial nominal value of resistance of said resistor to a lower desired value, and forming a plurality of short-circuiting shunts on said insulative member, said shunts extending between different spaced points along the body portion of said resistor so as to initially respectively short out those segments of the resistor body portion disposed therebetween, said shunts, when selectively opened, causing the nominal value of resistance of said resistor selectively as fabricated and subsequently adjusted to be increased by a predetermined magnitude, whereas a short-circuit connection when established between any two selected ones of said bonding pads will cause the resistance of said resistor to be lowered by a predetermined magnitude.

24. A method in accordance with claim 23 comprising the further step of:

conductively interconnecting at least two of said spaced array of bonding pads with an auxiliary conductive member so as to provide a short-circuit path around that part of the resistor body portion therebetween and, thereby, lower the nominal value of resistance of said resistor as fabricated by a desired predetermined magnitude for a given circuit application.

25. A method in accordance with claim 23 further comprising the step of:
opening at least a selected one of said short-circuiting shunts so as to increase the value of resistance then exhibited by said resistor by a predetermined magnitude to a higher desired value.

26. A method in accordance with claim 23 further comprising the steps of:
opening at least a selected one of said short-circuiting shunts, and
establishing at least one short-circuit connection, and between two selected ones of said bonding pads, after fabrication of said resistor, to effect an adjustment of an initial value of resistance of said resistor by a predetermined incremental magnitude, in a predetermined direction, to produce a desired final value of resistance on the selected side of the initial value.

* * * * *